(12) United States Patent
Lee et al.

(10) Patent No.: US 9,984,734 B2
(45) Date of Patent: May 29, 2018

(54) PROGRAMMABLE INTEGRATED CIRCUITS WITH IN-OPERATION RECONFIGURATION CAPABILITY

(71) Applicant: Altera Corporation, San Jose, CA (US)

(72) Inventors: Andy L. Lee, Sunnyvale, CA (US); Shankar Sinha, San Jose, CA (US); Ning Cheng, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days. days.

(21) Appl. No.: 15/471,325

(22) Filed: Mar. 28, 2017

(65) Prior Publication Data

US 2017/0200484 A1    Jul. 13, 2017

Related U.S. Application Data

(63) Continuation of application No. 15/061,440, filed on Mar. 4, 2016, now Pat. No. 9,607,671, which is a continuation of application No. 14/331,470, filed on Jul. 15, 2014, now Pat. No. 9,299,396.

(51) Int. Cl.
| | | |
|---|---|---|
| *G11C 7/00* | (2006.01) | |
| *G11C 7/22* | (2006.01) | |
| *G11C 5/14* | (2006.01) | |
| *G11C 7/20* | (2006.01) | |

(52) U.S. Cl.
CPC ............ *G11C 7/22* (2013.01); *G11C 5/14* (2013.01); *G11C 7/20* (2013.01)

(58) Field of Classification Search
CPC ....... G11C 11/413; G11C 11/419; G11C 5/14; G11C 7/20; G11C 11/417; G11C 11/41; G11C 11/412; G11C 11/418; G11C 29/02; G11C 29/021; G11C 29/028; G11C 29/24; G11C 29/50; G11C 5/147
USPC ............... 365/226, 154, 200, 201, 190, 227, 365/230.05, 230.06
See application file for complete search history.

(56) References Cited

U.S. PATENT DOCUMENTS

| | | |
|---|---|---|
| 5,581,500 A | 12/1996 | D'Souza |
| 6,184,709 B1 | 2/2001 | New |
| 6,326,806 B1 | 12/2001 | Fallside et al. |
| 7,768,818 B1 | 8/2010 | Chan et al. |

(Continued)

*Primary Examiner* — Thong Q Le
(74) *Attorney, Agent, or Firm* — Treyz Law Group, P.C.; Jason Tsai

(57) ABSTRACT

Integrated circuits may include partial reconfiguration (PR) circuitry for reconfiguring only a portion of a memory array. In some applications, partial reconfiguration may be performed during user mode. During partial reconfiguration, write assist techniques such as varying the power supply voltage may be applied to help increase write margin, but doing so can potentially affect the performance of in-operation pass gates that are being controlled by the memory array during user mode. In one suitable arrangement, ground power supply voltage write assist techniques may be implemented on memory cells that include p-channel access transistors and that are used to control n-channel pass transistors. In another suitable arrangement, positive power supply voltage write assist techniques may be implemented on memory cells that include n-channel access transistors and that are used to control p-channel pass transistors.

18 Claims, 10 Drawing Sheets

(56) References Cited

U.S. PATENT DOCUMENTS

| | | |
|---|---|---|
| 7,864,620 B1 | 1/2011 | Pederson |
| 7,975,068 B2 | 7/2011 | Schlansker et al. |
| 2009/0207650 A1 | 8/2009 | Braceras et al. |
| 2011/0242880 A1* | 10/2011 | White .................. G11C 7/02 |
| | | 365/154 |
| 2012/0008449 A1 | 1/2012 | Chuang et al. |
| 2013/0162290 A1 | 6/2013 | Margabandu et al. |

* cited by examiner

PROGRAMMABLE INTEGRATED CIRCUITS WITH IN-OPERATION RECONFIGURATION CAPABILITY

This application is a continuation of U.S. patent application Ser. No. 15/061,440, filed Mar. 4, 2016, which is a continuation of U.S. patent application Ser. No. 14/331,470, filed Jul. 15, 2014. This application claims the benefit of and claims priority to U.S. patent application Ser. No. 15/061,440, filed Mar. 4, 2016, and U.S. patent application Ser. No. 14/331,470, filed Jul. 15, 2014, which is hereby incorporated by reference herein in their entireties.

BACKGROUND

This relates to integrated circuits and more particularly, to programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements to configure the devices to perform the functions of the custom logic circuit.

Memory elements are often formed using random-access-memory (RAM) cells. Because the RAM cells are loaded with configuration data during device programming, the RAM cells are sometimes referred to as configuration memory or configuration random-access-memory cells (CRAM).

During normal operation of a programmable device, loaded CRAM cells produce static output signals that are applied to the gates of transistors (e.g., pass transistors). The CRAM output signals turn some transistors on and turn other transistors off. This selective activation of certain transistors on the programmable device customizes the operation of the programmable device so that the programmable device performs its intended function.

Configuration data may be supplied to a programmable device in the form of a configuration bit stream. After a first configuration bit stream has been loaded onto a programmable device, the programmable device may be reconfigured by loading a different configuration bit stream in a process known as reconfiguration. An entire set of configuration data is often loaded during reconfiguration. However, it may sometimes be advantageous to reconfigure only a portion of the configuration bits using a process known as partial reconfiguration.

SUMMARY

A programmable integrated circuit that includes memory elements and partial reconfiguration circuitry operable to reconfigure a selected portion of the memory elements is provided. The memory elements may be arranged in rows and columns and may collectively be referred to as a memory array.

Partial reconfiguration may be performed on a first portion of memory elements in the array during normal user mode. The first portion of memory elements may receive a power supply voltage via a power supply line. During the partial reconfiguration, the write margin for the first portion of memory elements may be enhanced by temporarily adjusting the power supply voltage.

A second portion of memory elements in the array may also receive the power supply voltage from the power supply line. During user mode, the second portion of memory elements may control corresponding pass gates that are actively being used by the programmable integrated circuit to route user signals from a first logic region to a second logic region on the integrated circuit. The pass gates that are being controlled by the second portion of memory elements should exhibit performance (e.g., drive strengths) that is unaffected by the temporary adjustment in the power supply voltage.

In one suitable arrangement, the memory elements in the array may include p-channel access transistors. Memory elements with p-channel access transistors should be used in conjunction with write assist circuits that temporarily raise a ground power supply voltage Vss during data loading operations. In order for the associated pass gates to be unperturbed during such instances, n-channel pass transistors may be used so as to remain in cutoff mode during Vss adjustments (as long as the variation in Vss remains less than the n-channel transistor threshold voltage level Vth,n).

In another suitable arrangement, the memory elements in the array may include n-channel access transistors. Memory elements with n-channel access transistors should be used in conjunction with write assist circuits that temporarily lower a positive power supply voltage Vcc during partial reconfiguration operations. In order for the drive strengths of the associated pass gates to be unchanged during such instances, p-channel pass transistors may be used so as to remain in cutoff mode during Vcc adjustments (as long as the variation in Vcc remains less than the p-channel transistor threshold voltage level Vth,p).

Further features of the present invention, its nature and various advantages will be more apparent from the accompanying drawings and the following detailed description.

DETAILED DESCRIPTION

Embodiments of the present invention relate to integrated circuits and more particularly, to integrated circuits with memory elements. Integrated circuits such as programmable integrated circuits use programmable memory elements to store configuration data. During programming of a programmable integrated circuit, configuration data is loaded into the memory elements. Memory elements may be organized in arrays having numerous rows and columns. For example, memory array circuitry may be formed in hundreds or thousands of rows and columns on a programmable logic device integrated circuit.

During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

In some arrangements, the memory elements may be used to provide control signals to routing pass gates (e.g., pass transistors that are used to route user signals from one logic region to another). It may sometimes be desirable to reconfigure only a portion of the memory elements during normal operation. This type of reconfiguration in which only a subset of memory elements are being loaded with new configuration data is sometimes referred to as "partial reconfiguration."

During partial reconfiguration, new data should be written into a selected portion of memory elements (sometimes referred to as "memory cells"). In order to increase write margin, write assist techniques such as varying the memory cell power supply voltage may be applied. Varying the memory cell power supply voltage during in-operation partial reconfiguration can, however, affect memory cells that are not currently being reconfigured but are driven by the same power supply line. To mitigate this undesired effect, particular types of transistors may be chosen such that the write assist does not inadvertently impact the performance of in-operation routing pass gates.

As an example, a memory element that controls a corresponding n-channel pass gate transistor may be provided with p-channel access transistors, which allows ground write assist techniques to be implemented. This may be desirable since n-channel pass gate transistors are immune to small voltage variations near ground voltage Vss. As another example, a memory element that controls a corresponding p-channel pass gate transistor may be provided with n-channel access transistors, which allows positive power supply voltage write assist techniques to be implemented. This may be desirable since p-channel pass gate transistors are not affected by small voltage variations near positive power supply voltage Vcc.

Figure 1:
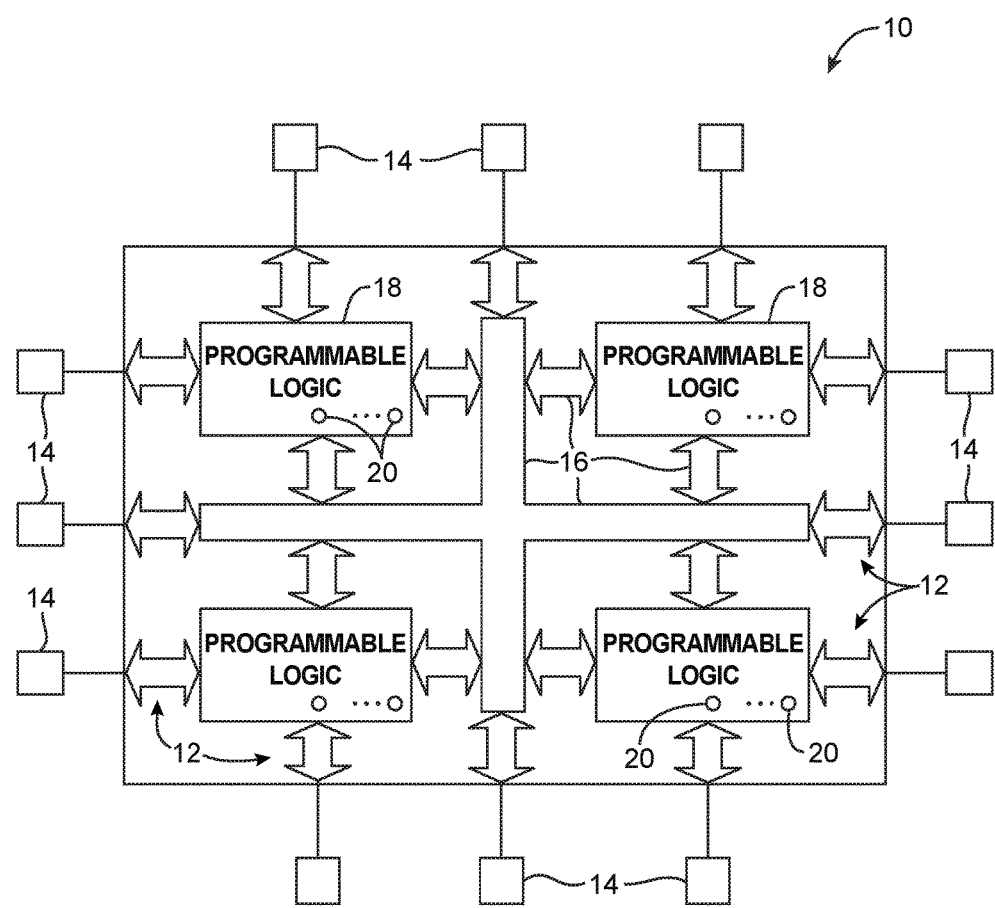
FIG. 1 is a diagram of an illustrative programmable integrated circuit in accordance with an embodiment of the present invention.

An illustrative programmable integrated circuit that may be provided with memory cells for use in driving corresponding pass gates which are not affected by memory cell power supply write assist techniques is shown in FIG. 1. As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements 20 may each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
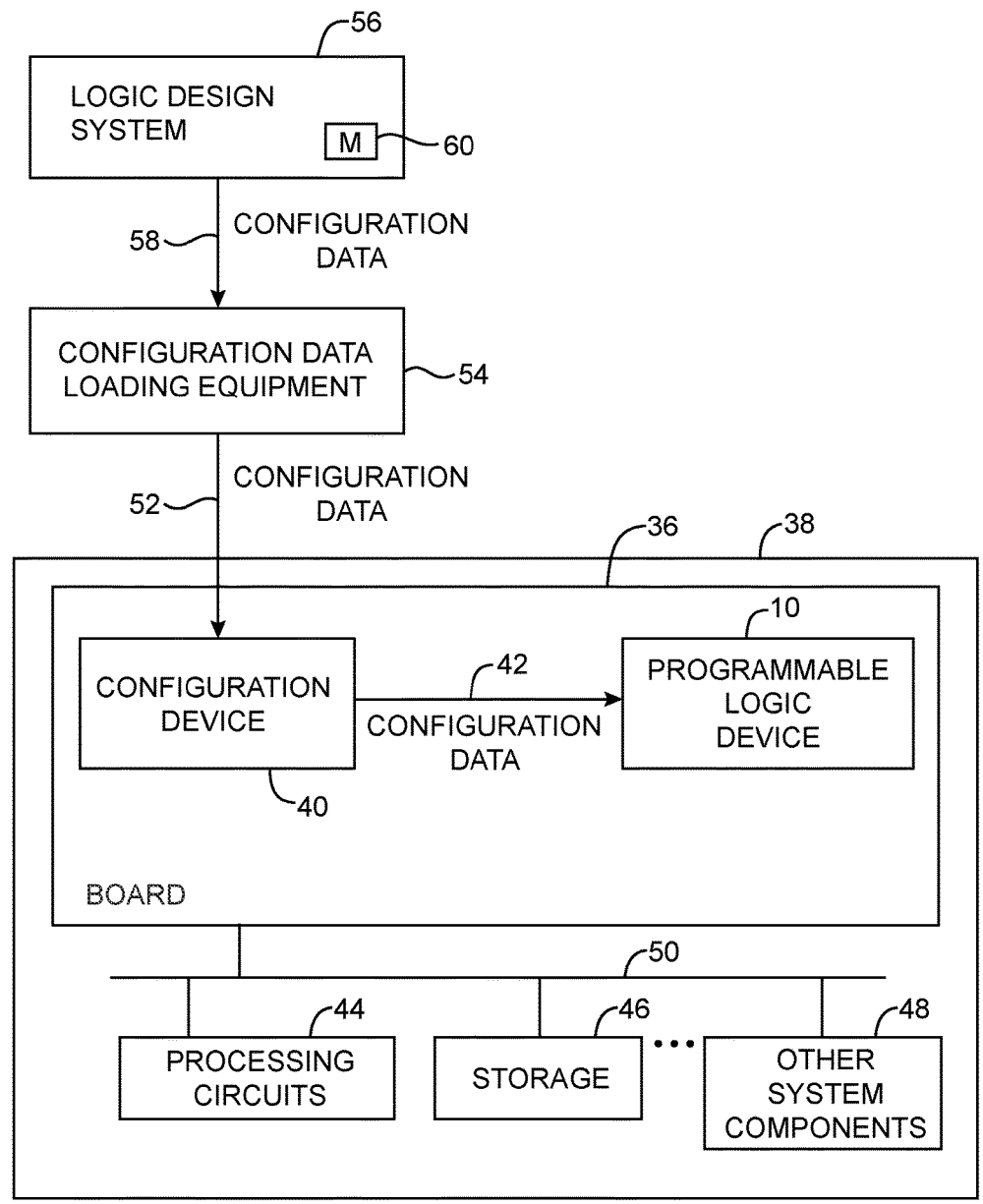
FIG. 2 is a diagram showing how configuration data is created by a logic design system and loaded into a programmable device to configure the device for operation in a system in accordance with an embodiment of the present invention.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a "configuration device"), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses, traces, and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. Logic design system 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38.

Figure 3:
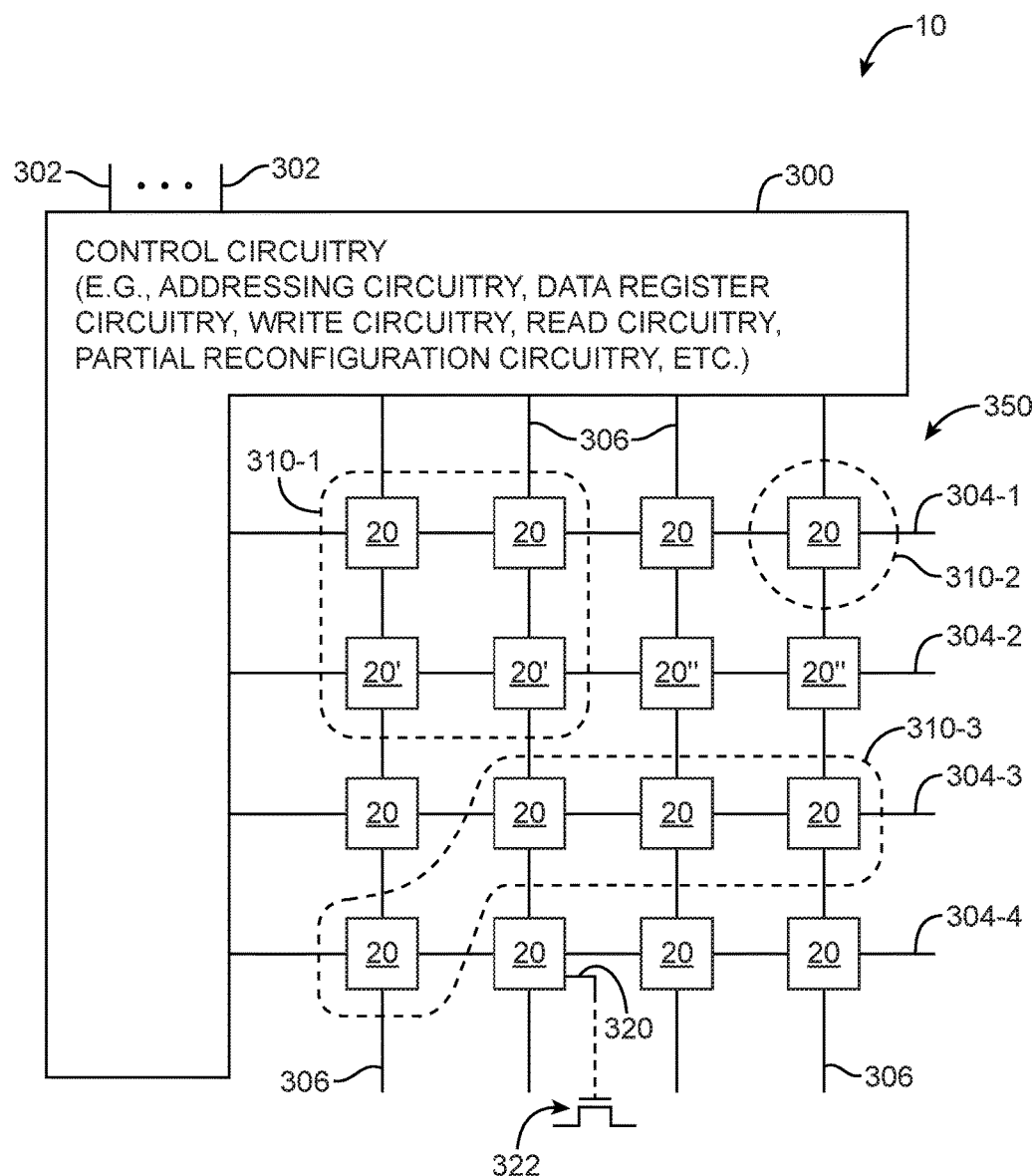
FIG. 3 is a diagram of an illustrative array of memory elements, a portion of which can be reconfigured during user operation in accordance with an embodiment of the present invention.

Any suitable memory array architecture may be used for memory cells 20. One suitable arrangement is shown in FIG. 3. There are only four rows and four columns of memory cells 20 in the illustrative array of FIG. 3, but in general there may be hundreds or thousands of rows and columns in memory array 350. Array 350 may be one of a number of arrays on a given device 10, may be a subarray that is part of a larger array, or may be any other suitable group of memory cells 20.

Each memory element 20 may be formed from a number of transistors configured to form a bistable circuit (e.g., a latch-type circuit). True and complement data storage nodes in the bistable circuit element can store corresponding true and complement versions of a data bit.

A bistable circuit element may be based on any suitable number of transistors. For example, the bistable portion of each memory element may be formed from cross-coupled inverters, from groups of multiple inverter-like circuits (e.g., in a distributed configuration that provides enhanced immunity from soft-error-upset events, etc.), from two or more inverting circuits having control transistors for enhancing read/write margins, etc. Arrangements with bistable elements formed from cross-coupled inverting pairs are sometimes described herein as an example. This is, however, merely illustrative. Memory elements 20 may be formed using any suitable memory cell architecture.

Each memory element may supply a corresponding output signal at a corresponding output path 320. In CRAM arrays, each output signal serves a static output control signal that may be conveyed to a corresponding transistor such as transistor 322 or other circuit element in an associated programmable logic circuit. Transistor 322 may serve to route one programmable logic region to another and may be referred to as a single-transistor pass gate or a pass transistor.

Integrated circuit 10 may include control circuitry 300 for supplying signals to memory array 350. Control circuitry 300 may receive power supply voltages, data, and other signals from external sources using input-output pins (e.g., pins 14 in FIG. 1) and from internal sources using paths such as paths 302. Control circuitry 300 may include circuitry such as addressing circuitry, data register circuitry, write circuitry, read circuitry, partial reconfiguration (PR) circuitry, just to name a few. Control circuitry 300 may use the power supply voltages supplied from the input-output pins to produce desired time-varying and fixed signals on paths such as paths 304 (i.e., paths 304-1, 304-2, 304-3, and 304-4) and paths 306.

There may, in general, be any suitable number of conductive lines associated with paths 304 and 306. For example, each row in array 350 may have associated address lines (e.g., one or more word lines) and associated read/write enable lines in a respective one of paths 304 (as examples). Each column of array 350 may have a respective path 306 that includes data lines (e.g., a true data line and a complement data line). In certain embodiments, a clear signal may also be routed to all of the cells in array 350 simultaneously over a common clear line. The clear line may be oriented vertically so that there is one branch of the clear line in each path 306 or may be oriented horizontally so that there is one branch of the clear line in each path 304. The clear line need not be necessary.

Power can also be distributed in this type of global fashion. For example, a positive power supply voltage Vcc may be supplied in parallel to each cell 20 using a pattern of shared horizontal or vertical conductors. A ground power supply voltage Vss may likewise be supplied in parallel to cells 20 using a pattern of shared horizontal or vertical lines. Control lines such as address lines and data lines are typically orthogonal to each other (e.g., address lines are horizontal while data lines are vertical or vice versa).

The terms "rows" and "columns" merely represent one way of referring to particular groups of cells 20 in memory array 350 and may sometimes be used interchangeably. If desired, other patterns of lines may be used in paths 304 and 306. For example, different numbers of power supply signals, data signals, and address signals may be used.

The signals that are supplied to memory elements 20 may sometimes be collectively referred to as control signals. In particular contexts, some of these signals may be referred to as power signals, clear signals, data signals, address signals, etc. These different signal types are not mutually exclusive. For example, a clear signal for array 350 may serve as a type of control (address) signal that can be used to clear array 350. This clear signal may also serve as a type of power signal by powering inverter-like circuitry in cells 20. Likewise, because clearing operations serve to place logic zeros in memory cells 20, clear signals may serve as a type of data signal.

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, 0.8 volts, less than 0.8 volts, or any other suitable voltage. Ground voltage Vss may be zero volts, 0.1 volts, −0.15 volts, or any other suitable low voltage (as examples). In a typical arrangement, power supply voltages Vcc may be 0.85 volts, Vss may be zero volts, and the signal levels for address, data, and clear signals may range from zero volts (when low) to 1.1 volts (when high). Arrangements in which Vcc varies as a function of time, in which Vss is less than zero volts, and in which control signals are overdriven (i.e., in which control signals have signal strengths larger than Vcc-Vss) may also be used.

After device 10 is initially loaded with a set of configuration data (e.g., using configuration device 40 as described in connection with FIG. 2), device 10 may be reconfigured by loading a different set of configuration data. Sometimes it may be desirable to reconfigure only a portion of the memory cells on device 10 via a process sometimes referred to as partial reconfiguration. As memory cells are typically arranged in an array, partial reconfiguration can be performed by writing new data values only into selected portion(s) in the array while leaving portions of array other than the selected portion(s) in their original state.

Referring again to FIG. 3, consider a first example in which a rectangular portion 310-1 of memory cell array 350 is being reconfigured while the remaining portion of array 350 retains their current configuration data. Consider a second example in which a single memory cell (as indicated by array portion 310-2 is being reconfigured while other parts of array 350 continues to hold their current configuration data. Consider yet another example in which another group 310-3 of memory cells in array 350 is being reconfigured while all other memory cells retain their original data value. These examples are merely illustrative. In general, reconfiguration circuitry on device 10 (not shown) may be used to reconfigure any desired portion or portions of memory on device 10.

In certain applications, it may be desirable to perform partial reconfiguration on device 10 while device 10 is in normal user operation. Performing partial reconfiguration during user operation (sometimes referred to as "in-operation partial reconfiguration") may introduce challenges that can otherwise be neglected if the device is not being actively used to perform a custom user function.

Consider the first example described above where portion 310-1 of array 350 is being reconfigured during normal user operation. Assume, in this example, that each memory cell 20 that is coupled to control path 304-2 in the second row is coupled to a given address line and is powered by a common power supply voltage Vcc. Assume also that the common Vcc needs to be temporarily lowered during partial reconfiguration to help improve memory cell write margin. The step of dynamically lowering Vcc during a memory write operation serves to improve the write-ability of the memory cell and is therefore sometimes referred to as a memory "write assist" technique.

In order to write new data bits into the two leftmost memory cells 20' in the second row, an address signal on the given address line will have to be asserted while the common power supply voltage is reduced. Because all the memory cells in second row are powered using the common power supply voltage, this reduction in the common power supply voltage will also affect the two right-most cells 20" in the second row.

During normal operation, cells 20" output static control signals to corresponding pass gates 322, which are actively being used to route user signals from one logic circuit to another. Any change in the power supply voltage will actually change the voltage level of the static control signals, which would result in varying the drive strength of the routing pass gates. Varying the drive-ability of routing pass gates that are actively being used to route user signals is generally undesired, as doing so can potentially introduce timing issues in the user design.

It would therefore be desirable to provide improved memory circuitry that support memory write assists during partial reconfiguration without affecting the drive strength of in-operation pass gates.

Figure 4:
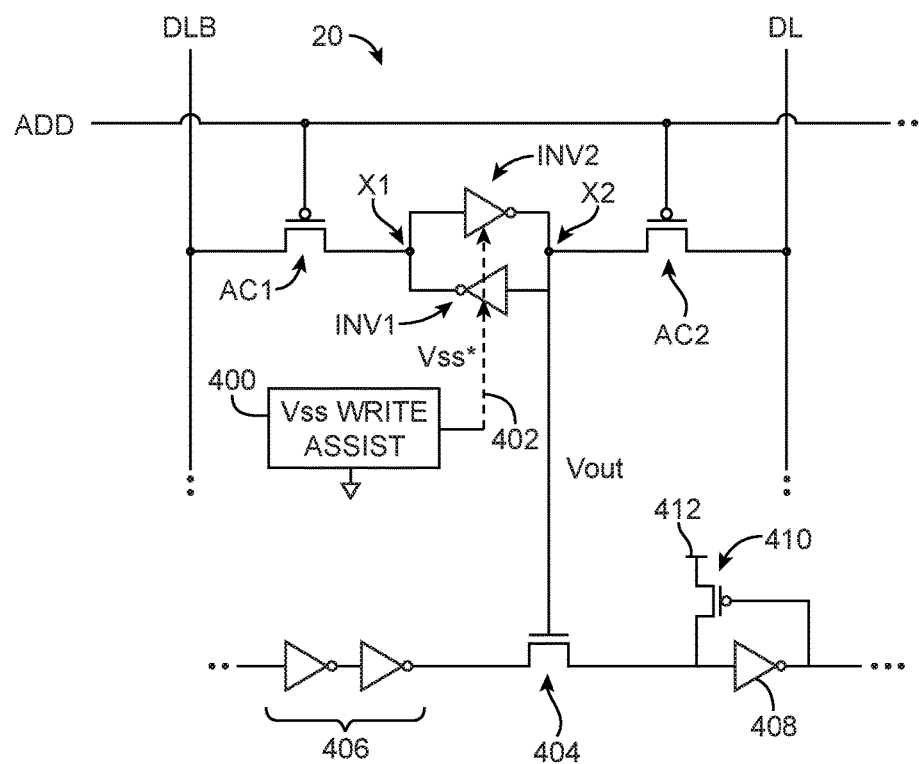
FIG. 4 is a circuit diagram of an illustrative memory element with p-channel access transistors, where the memory element is used to control a corresponding n-channel routing pass gate accordance with an embodiment of the present invention.

FIG. 4 is a circuit diagram showing one suitable arrangement of memory cell 20 that supports Vss write assists without affecting the performance of in-operation pass transistors. As shown in FIG. 4, the storage portion of cell 20 may include cross-coupled inverting circuits such as circuits INV1 and INV2 each of which has an input, an output, and at least one power supply terminal such as a ground power supply terminal that is configured to receive memory cell power supply voltage Vss* from Vss write assist circuit 400.

In particular, the input of circuit INV1 may be coupled to the output of circuit INV2, whereas the input of INV2 may be coupled to the output of circuit INV1. The output of circuit INV1 may serve as a first internal data storage node X1 for cell 20 while the output of circuit INV2 may serve as a second internal data storage node X2 for cell 20. The storage portion of cell 20 configured in this way may be used to store a single bit of data (e.g., data storage nodes X1 and X2 may store complement and true versions of a single data bit, respectively). As an example, cell 20 that is storing a high data bit may have data storage nodes X1 and X2 respectively driven to "0" and "1." As another example, cell 20 that is storing a low data bit may have data storage nodes X1 and X2 respectively driven to "1" and "0." Static control voltage signal Vout may be provided at storage node X2 and may be routed to a corresponding pass gate transistor.

The storage portion of memory cell 20 may be coupled to access transistors AC1 and AC2 to perform read and write operations. In the example of FIG. 4, access transistor AC1 may be coupled between a first data line (e.g., a data line on which complement data signal DLB is provided) and first data storage node X1, whereas access transistor AC2 may be coupled between a second data line (e.g., a true data line on which true data signal DL is provided) and second data storage node X2. Transistors AC1 and AC2 may each have a gate that is coupled to an address line on which address signal ADD is conveyed. Transistors AC1 and AC2 may therefore sometimes be referred to as address transistors. The address line is sometimes referred to as a "word line." Address signal ADD provided on the word line may therefore sometimes be referred to as a word line signal.

During normal memory operation, the true and complementary data lines may be nominally driven to zero volts to minimize leakage currents while address signal ADD is deasserted (e.g., address signal ADD may be pulled low to disable access transistors AC1 and AC2). For example, address signal ADD may be driven to −0.1 V to reduce leakage currents through access transistors AC1 and AC2. If desired, address signal ADD may be driven to −0.2 V or other negative voltages to further reduce leakage through the access transistors.

During write operations, desired data signals may be presented on the first and second data lines. Address signal ADD may then be asserted to enable access transistors AC1 and AC2 to write in a desired value into memory cell 20. As an example, data line signals DL and DLB may be respectively driven to logic "1" and "0" to load a high data bit into memory cell 20 using the activated access transistors AC1 and AC2 (e.g., to drive Vout high). As another example, data line signals DL and DLB may be respectively driven to logic "0" and "1" to load a low data bit into memory cell 20 using the activated access transistors AC1 and AC2 (e.g, to drive Vout low).

The read performance of memory cell 20 may be characterized by a metric commonly referred to as read noise margin or static noise margin (SNM), whereas the write performance of memory cell 20 may be characterized by another metric commonly referred to as write noise margin (WNM). The read static noise margin may be dependent on the relative drive strength between the access transistors and any pull-down transistors in the storage portion of memory cell 20. In particular, it may be desirable minimize the ratio of access transistor drive strength to pull-down transistor drive strength so as to optimize read static noise margin (e.g., it may be desirable to increase the drive-ability of the pull-down transistors in INV1 and INV2 relative to that of the access transistors to ensure that data does not inadvertently flip during read operations).

On the other hand, write noise margin may be dependent on the relative drive strength between the access transistors and the pull-up transistors of memory cell 20. In particular, it may be desirable to maximize the ratio of access transistor drive strength to pull-up transistor drive strength so as to optimize write noise margin.

The read and write noise margin described above relates to memory cells with n-channel access transistors. The example of FIG. 4 illustrates another suitable arrangement in which memory cell 20 includes access transistors AC1 and AC2 implemented using p-channel transistors. When p-channel access transistors are used, it may generally be desirable to optimize read static noise margin by minimizing the p-channel access transistor drive strength to that of the pull-up transistors in INV1, INV2 and to optimize write margin by maximizing the ratio of the p-channel access transistor drive strength to that of the pull-down transistors in INV1, INV2. P-channel transistors (sometimes referred to as "pull-up" transistors) are generally better at passing high data values relative to re-channel "pull-down" transistors. When writing a new value into a memory cell, a p-channel access transistor has to overpower the corresponding n-channel pull-down transistor in one of the cross-coupled inverters. To assist the p-channel access transistor in overpowering the pull-down transistor, it would therefore be desirable to raise the ground voltage level towards which the pull-down transistor is pulling.

As a result, the use of p-channel access transistors may be most suitably paired with Vss write assist circuit 400. Write assist circuit 400 may be configured to temporarily increase the voltage level of Vss* during write operations and to drive Vss* down to its nominal voltage level at all other times. Voltage Vss* may have a nominal voltage level of zero volts, −0.1 volts, or −0.15 volts (as examples). Changing voltage Vss* during write operations will change the voltage level of a low static control signal Vout that is being output to a corresponding pass transistor.

Figure 5:
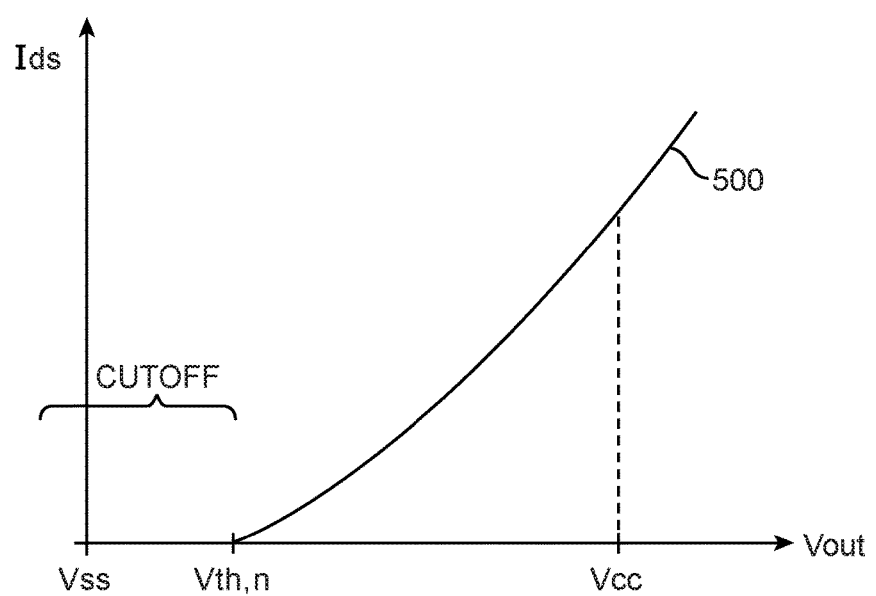
FIG. 5 is a plot illustrating an asymmetric drive strength characteristic associated with an n-channel routing pass gate in accordance with an embodiment of the present invention.

It may therefore be desirable to deliberately choose a pass transistor whose performance is substantially unperturbed by variations near ground voltage Vss. FIG. 5 plots the source-drain current Ids of an n-channel pass transistor as a function of gate control voltage Vout (e.g., the static control voltage that is provided at the output of memory cell 20). As shown by curve 500 in FIG. 5, current Ids remains around zero for Vout values below the n-channel transistor turn-on threshold voltage Vth,n (e.g., the n-channel transistor remains in the cut-off region for gate voltages below Vth,n). As Vout increases above Vth,n, Ids will steadily increase (i.e., near Vcc levels, any variation in the positive power supply voltage will result in a non-negligible change in Ids). In other words, an n-channel pass gate transistor may be sensitive to Vout variations near Vcc but is insensitive to Vout variations near Vss, as long as the amount of variation remains less than Vth,n.

In accordance with an embodiment, the memory cell 20 of FIG. 4 leverages this asymmetric turn-on behavior of an n-channel transistor by pairing the memory cell with Vss write assist to an n-channel transistor such as n-channel pass gate transistor 404. Arranged in this way, any change in memory cell power supply voltage Vss* (assuming Vss* remains below Vth,n) during any data loading operations including partial reconfiguration operations will not affect the drive strength of n-channel pass transistor 404. In other words, the performance of pass transistor 404 during user operation will not be affected even if the control voltage Vout that transistor 404 receives varies slightly around the nominal ground voltage level Vss since transistor 404 will remain in the cutoff mode.

In general, transistor 404 may serve as a single pass transistor for routing user signals from one programmable logic region to another. For example, pass transistor 404 may serve as part of a multiplexing circuit for routing signals from a first logic block 18 to a second logic block 18 on device 10 (see, FIG. 1). In the example of FIG. 4, transistor 404 may receive input signals from driver circuits 406 (e.g., output driver circuits from a first logic region) and may selectively route the received input signals to a second logic region via driver circuit 408. A pull-up transistor such as p-channel transistor 410 may have a drain terminal that is connected to the input of driver 408, a gate terminal that is connected to the output of driver 408, and a source terminal that is connected to a positive power supply line 412. Connected in this way, transistor 410 may help transistor 404 pass through a logic "1" signal (since n-channel transistors sometimes have difficulty pulling a signal all the up to Vcc). Pull-up transistor 410 used in this way may sometimes be referred to as a "half-latch" circuit.

This particular combination of a memory cell 20 implementing Vss write assist (which is enabled by the use of p-channel access transistors) with n-channel pass transistors is what allows the memory cell to apply write assist techniques to increase write margin during in-operation partial reconfiguration without affecting the performance of the associated pass gate transistors which are actively being used to route user signals.

In at least some embodiments, it may be desirable for the memory cell positive power supply voltage (e.g., the positive power supply voltage that is powering INV1 and INV2 within memory cell 20) to be greater than the data path positive power supply voltage level (e.g., the positive power supply voltage that is powering buffers 406/408 and half-latch 410). Configured in this way, the higher memory cell voltage can help to further overdrive and enhance the performance of the n-channel pass transistor 404. In other words, the control signal Vout that is output by memory cell 20 may exhibit a voltage swing that is greater than that of the user signals that are being routed through the n-channel pass transistors 404.

Figure 6:
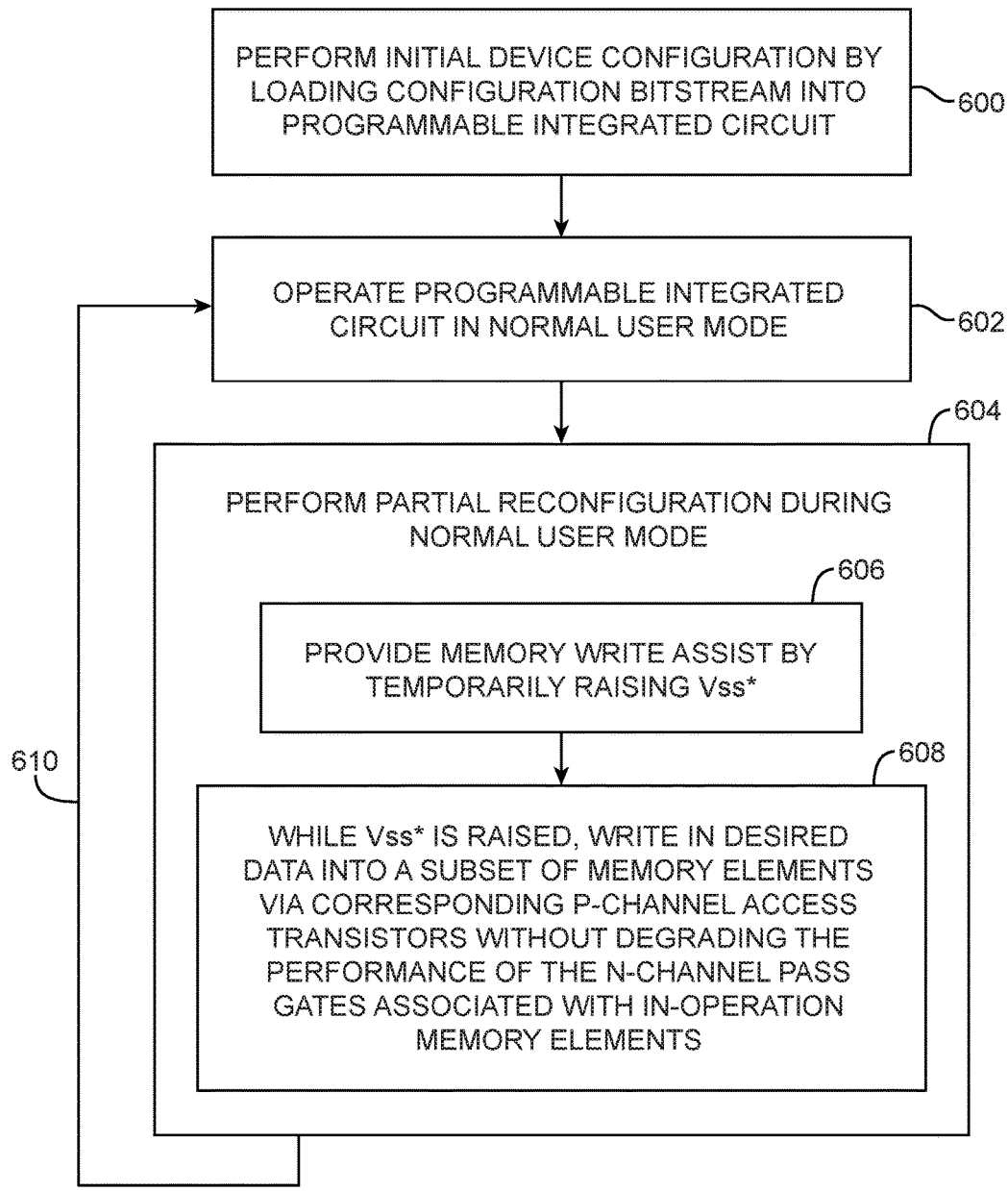
FIG. 6 is a flow chart of illustrative steps involved in operating the memory element of FIG. 4 in accordance with an embodiment of the present invention.

FIG. 6 is a flow chart of illustrative steps involved in operating a memory element of the type described in connection with FIG. 4. At step 600, an initial device configuration operation may be formed on device 10 by loading a configuration bitstream into device 10. At step 602, device 10 may then be placed in normal user mode to perform the custom logic functions.

During user operation, the user or the application may wish to perform a partial reconfiguration operation to reconfigure only a portion of the configuration memory elements 20 on device 10 (step 604). To do so, a Vss write assist circuit may temporarily raise the memory cell ground voltage Vss* for at least the memory cells that are currently being reconfigured and for any associated memory cells that share the same ground power supply line (step 606). These associated memory cells sharing the same ground power supply line may be controlling in-operation n-channel pass transistors that are actively being used to route user signals.

While Vss* is raised, write driver circuits (not shown) may write in the desired reconfiguration data into the selected portion of memory elements 20 via corresponding p-channel access transistors without affecting the performance of the in-operation n-channel pass transistors associated with the memory elements sharing the same ground power supply line (step 608). Once the selected memory elements have been reconfigured, processing may loop back to step 602, as indicated by path 610.

Figure 7:
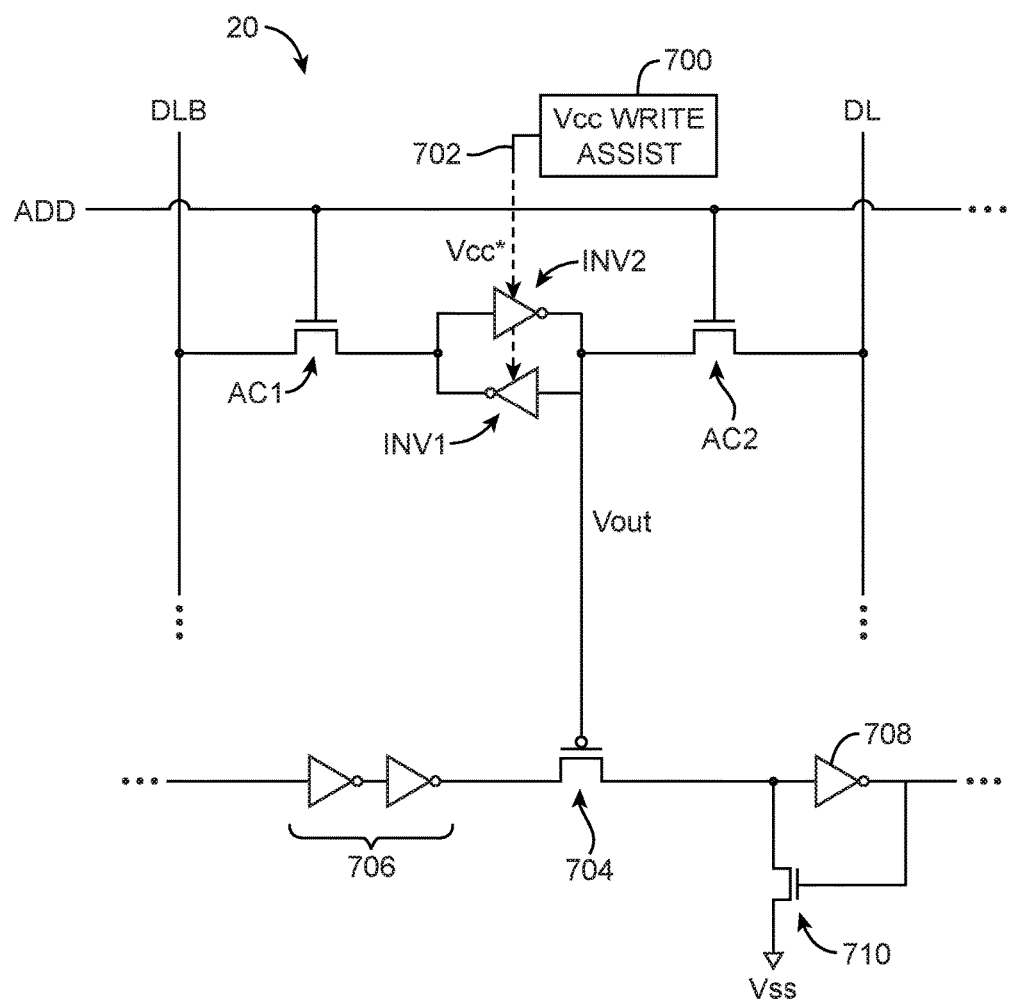
FIG. 7 is a circuit diagram of an illustrative memory element with n-channel access transistors, where the memory element is used to control a corresponding p-channel routing pass gate accordance with an embodiment of the present invention.

FIG. 7 is a circuit diagram showing another suitable arrangement of memory cell 20 which supports Vcc write assists without affecting the performance of in-operation pass transistors. As shown in FIG. 7, the storage portion of cell 20 may include cross-coupled inverting circuits such as circuits INV1 and INV2 each of which has at least one power supply terminal such as a positive power supply terminal that is configured to receive memory cell power supply voltage Vcc* from Vcc write assist circuit 400.

In the example of FIG. 7, access transistors AC1 and AC2 may be implemented using n-channel transistors. N-channel transistors are generally better at passing low data values relative to p-channel transistors. When writing a new value into a memory cell, an n-channel access transistor has to overpower the corresponding p-channel pull-up transistor in one of the cross-coupled inverters. To assist the n-channel access transistor in overpowering the pull-down transistor, it would therefore be desirable to lower Vcc* voltage level towards which the pull-up transistor is pulling.

As a result, the use of n-channel access transistors may be most suitably paired with Vcc write assist circuit 700. Write assist circuit 700 may be configured to temporarily decrease or "droop" the voltage level of Vcc* during write operations and to drive Vcc* up to its nominal voltage level at all other times. Voltage Vcc* may have a nominal voltage level of 0.85 volts, 1.1 volts for overdriving the pass transistors, or any other suitable positive power supply voltage level. Changing voltage Vcc* during write operations will change the voltage level of a high static control signal Vout that is being output to a corresponding pass transistor.

Figure 8:
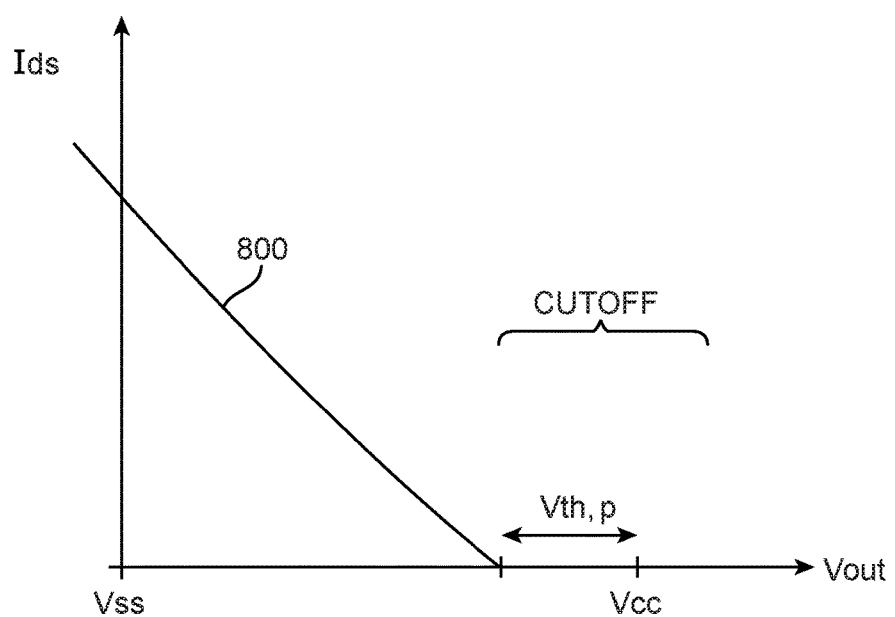
FIG. 8 is a plot illustrating an asymmetric drive strength characteristic associated with a p-channel routing pass gate in accordance with an embodiment of the present invention.

It may therefore be desirable to deliberately choose a pass transistor whose performance is substantially unperturbed by variations near positive power supply voltage Vcc. FIG. 8 plots the source-drain current Ids of a p-channel pass transistor as a function of gate control voltage Vout (e.g., the static control voltage that is provided at the output of memory cell 20). As shown by curve 800 in FIG. 8, current Ids remains around zero for Vout values within p-channel transistor turn-on threshold voltage Vth,p of Vcc (e.g., the p-channel transistor remains in the cut-off region for gate voltages greater than Vcc-Vth,p). As Vout decreases below Vcc-Vth,p, Ids will steadily increase (i.e., near Vss levels, any variation in the ground power supply voltage will result in a non-negligible change in Ids). In other words, a p-channel pass gate transistor may be sensitive to Vout variations near Vss but is insensitive to Vout variations near Vcc, as long as the amount of variation remains less than Vth,p.

In accordance with an embodiment, the memory cell 20 of FIG. 7 may leverage this asymmetric turn-on behavior of a p-channel transistor by pairing the memory cell with Vcc write assist to a p-channel transistor such as p-channel pass gate transistor 704. Arranged in this way, any change in memory cell power supply voltage Vcc* (assuming the amount of variation around Vcc* remains less than Vth,p) during any data loading operations including partial reconfiguration operations will not affect the drive strength of p-channel pass transistor 704. In other words, the performance of pass transistor 704 during user operation will not be affected even if the control voltage Vout that transistor 704 receives varies slightly around the nominal positive voltage level Vcc since transistor 704 will remain in the cutoff region.

In general, transistor 704 may serve as a single pass transistor for routing user signals from one programmable logic region to another. For example, pass transistor 704 may serve as part of a multiplexing circuit for routing signals from a first logic block 18 to a second logic block 18 on device 10 (see, FIG. 1). In the example of FIG. 7, transistor 704 may receive input signals from driver circuits 706 (e.g., output driver circuits from a first logic region) and may selectively route the received input signals to a second logic region via driver circuit 708. A pull-down transistor such as n-channel transistor 710 may have a drain terminal that is connected to the input of driver 708, a gate terminal that is connected to the output of driver 708, and a source terminal that is connected to a ground line. Connected in this way, transistor 710 may help transistor 704 pass through a logic "0" signal (since p-channel transistors sometimes have difficulty pulling a signal all the down to Vss). Pull-down transistor 710 used in this way may also sometimes be referred to as a "half-latch" circuit.

This particular combination of a memory cell 20 implementing Vcc write assist (which is enabled by the use of n-channel access transistors) with p-channel pass transistors is what allows the memory cell to apply write assist techniques to increase write margin during in-operation partial reconfiguration without affecting the performance of the associated pass gate transistors which are actively being used to route user signals.

Figure 9:
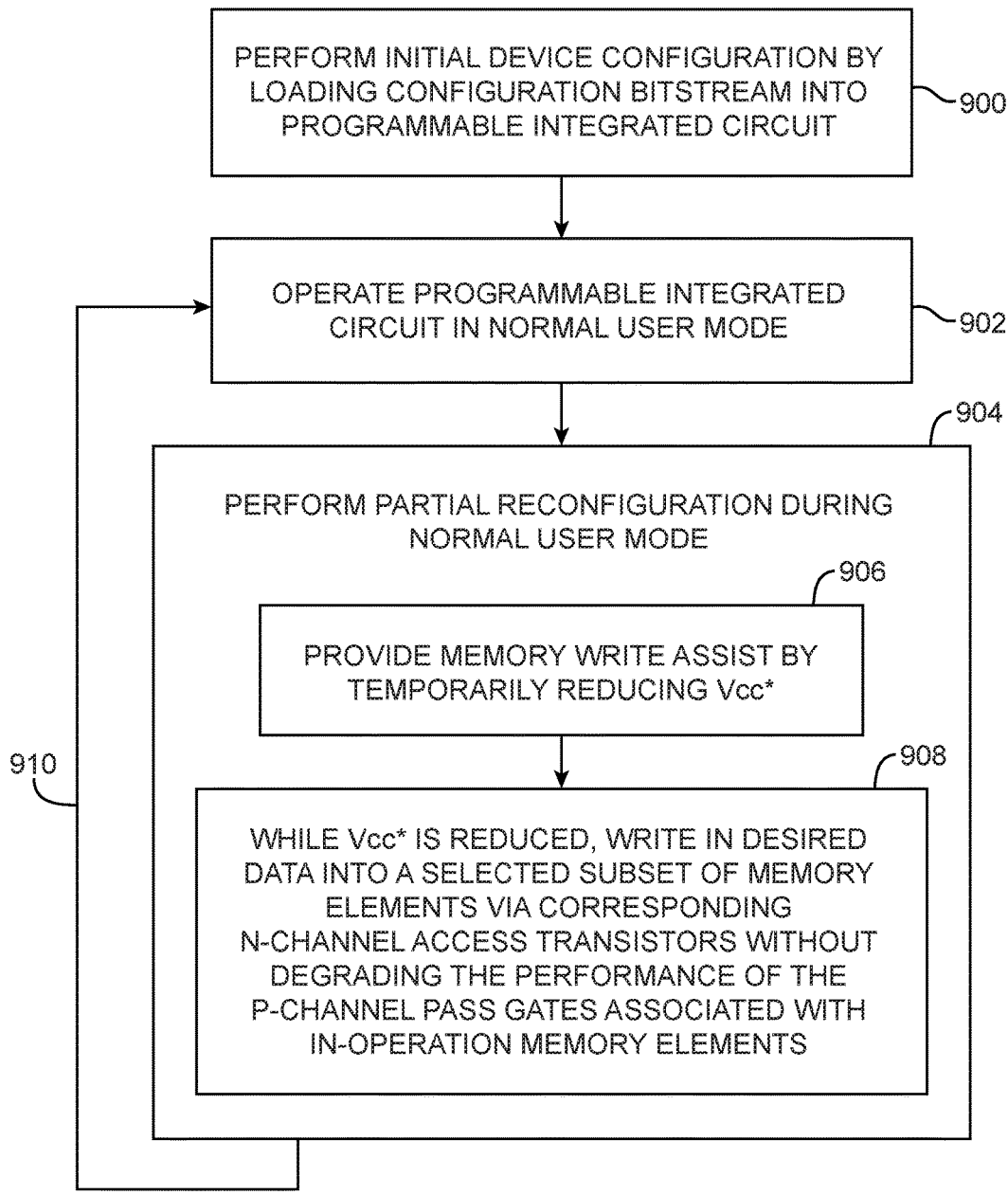
FIG. 9 is a flow chart of illustrative steps involved in operating the memory element of FIG. 7 in accordance with an embodiment of the present invention.

In at least some embodiments, it may be desirable for the memory cell ground voltage (e.g., the ground voltage that is powering INV1 and INV2 within memory cell 20) to be less than the data path ground power supply voltage level (e.g., the ground power supply voltage that is powering buffers 706/708 and half-latch 710). For example, if the data path ground level is zero volts, the memory cell ground voltage level may be negative. Configured in this way, the lowered memory cell voltage can help to further overdrive and enhance the performance of the p-channel pass transistor 704. In other words, the control signal Vout that is output by memory cell 20 may exhibit a voltage swing that is greater than that of the user signals that are being routed through the p-channel pass transistors 704. FIG. 9 is a flow chart of illustrative steps involved in operating a memory element of the type described in connection with FIG. 7. At step 900, an initial device configuration operation may be formed on device 10 by loading a configuration bitstream into device 10. At step 902, device 10 may then be placed in normal user mode to perform the custom logic functions.

During user operation, the user or the application may wish to perform a partial reconfiguration operation to reconfigure only a portion of the configuration memory elements 20 on device 10 (step 904). To do so, a Vcc write assist circuit may temporarily reduce the memory cell positive power supply voltage Vcc* for at least the memory cells that are currently being reconfigured and for any associated memory cells that share the same positive power supply line (step 906). These associated memory cells sharing the same power supply line may be controlling in-operation p-channel pass transistors that are actively being used to route user signals.

While Vcc* is lowered, write driver circuits (not shown) may write in the desired reconfiguration data into the selected portion of memory elements 20 via corresponding n-channel access transistors without affecting the performance of the in-operation p-channel pass transistors associated with the memory elements sharing the same positive power supply line (step 908). Once the selected memory elements have been reconfigured, processing may loop back to step 902, as indicated by path 910.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

If desired, device 10 may include both types of memory elements (i.e., the memory elements described in connection with FIG. 4 and the memory elements described in connection with FIG. 7) to help satisfy various transistor fabrication density requirements. For example, there may be density requirements that specify the minimum threshold for the number of n-channel transistors and the number of p-channel transistors that must be formed on device 10.

Figure 10:
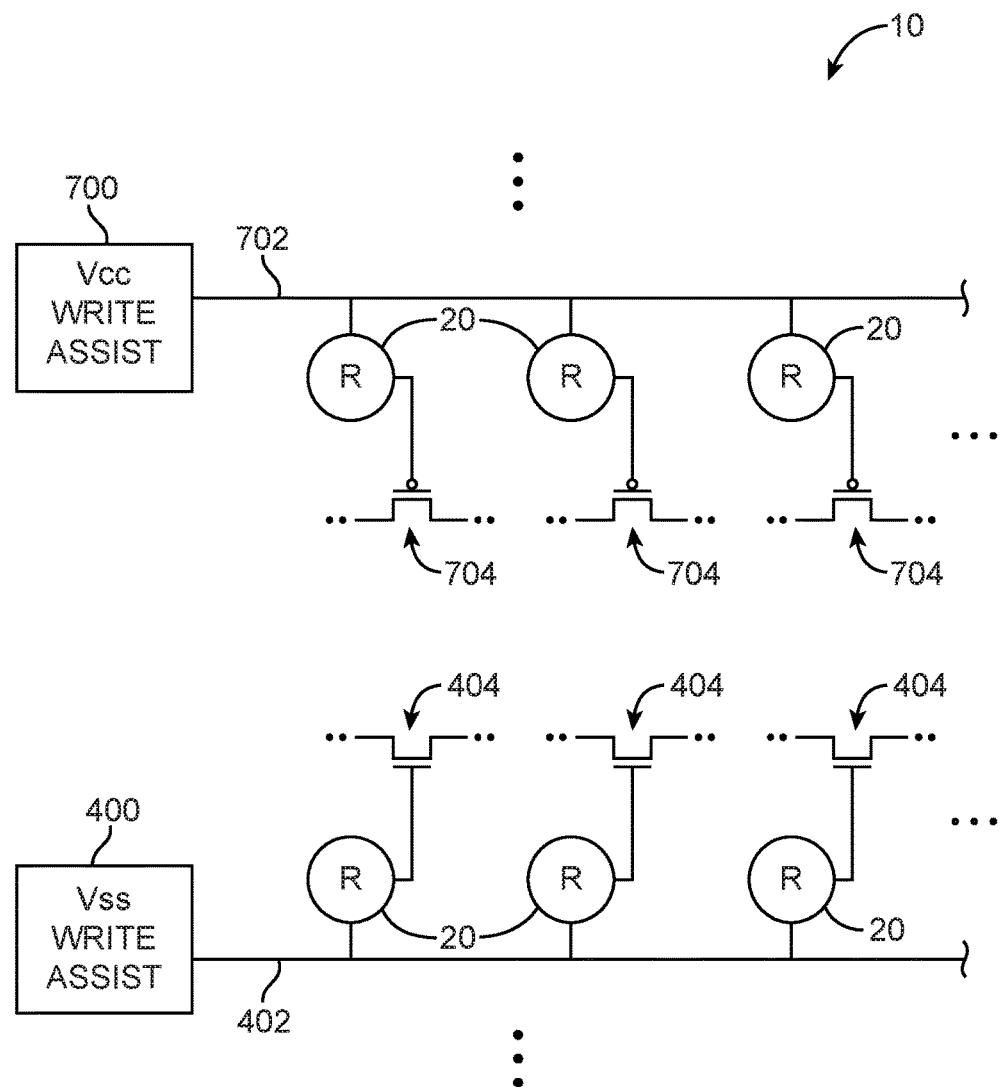
FIG. 10 is a diagram showing an illustrative integrated circuit having memory elements of the type shown in FIG. 4 and of the type shown in FIG. 7 to help satisfy re-channel and p-channel transistor density requirements in accordance with an embodiment of the present invention.

As shown in FIG. 10, device 10 may include a first group of memory cells 20 having positive power supply terminals coupled to Vcc write assist circuit 700 via path 702 and a second group of memory cells 20 having ground power supply terminals coupled to Vss write assist circuit 400 via path 402. The first group of memory cells may include n-channel access transistors and may be used to control corresponding p-channel pass gate transistors 704, whereas the second group of memory cells may include p-channel access transistors and may be used to control corresponding n-channel pass gate transistors 404.

If desired, any suitable technique(s) for optimizing the programmable logic and routing circuitry on device 10 may also be implemented. For example, the pass transistors may be formed from low threshold voltage (LVT) transistors to help maximize the drive-ability of the pass transistors. Other forms of modulating the memory control signals such as boosting the word line signal during memory access operations and/or overdriving the data lines during write operations may be implemented (as another example). The present embodiments may also be extended for use with CMOS transmission gates that include n-channel and p-channel pass gates coupled in parallel.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An integrated circuit comprising:
 a memory element that has an output, wherein the memory element comprises cross-coupled inverting circuits;
 a transistor that has a gate coupled to the output of the memory element, the transistor having a drive strength; and
 a control circuit that adjusts the memory element in a way that does not affect the drive strength of the transistor, wherein the control circuit adjusts a power supply voltage for the cross-coupled inverting circuits.

2. The integrated circuit of claim 1, wherein the transistor remains in cutoff mode while the control circuit adjusts the memory element.

3. The integrated circuit of claim 1, wherein the control circuit temporarily adjusts a ground power supply voltage.

4. The integrated circuit of claim 3, wherein the control circuit temporarily raises the ground power supply voltage.

5. The integrated circuit of claim 4, wherein the pass transistor is an n-channel transistor.

6. The integrated circuit of claim 5, wherein the memory element comprises a p-channel address transistor.

7. The integrated circuit of claim 1, wherein the control circuit temporarily adjusts a positive power supply voltage.

8. The integrated circuit of claim 7, wherein the control circuit temporarily reduces the positive power supply voltage.

9. The integrated circuit of claim 8, wherein the pass transistor is a p-channel transistor.

10. The integrated circuit of claim 9, wherein the memory element comprises an n-channel address transistor.

11. An integrated circuit comprising:
a memory element having an output;
a transistor having a gate coupled to the output of the memory element; and
a control circuit that adjusts the memory element such that the transistor stays in cutoff mode while writing data into the memory element.

12. The integrated circuit of claim 11, wherein the transistor has a threshold voltage level, and wherein the transistor has a gate-to-source voltage level that does not exceed the threshold voltage level while the control circuit adjusts the memory element.

13. The integrated circuit of claim 11, wherein the transistor has a drive strength that is unaffected while the control circuit adjusts the memory element.

14. The integrated circuit of claim 11, wherein the memory element comprises an access transistor having a first channel type, and wherein the transistor has a second channel type that is different than the first channel type.

15. The integrated circuit of claim 11, wherein the control circuit comprises a write assist circuit for increasing a write margin for the memory element.

16. An integrated circuit comprising:
a first memory cell;
a first pass transistor that is controlled by the first memory cell;
a second memory cell;
a second pass transistor that is controlled by the second memory cell, the second pass transistor having a drive strength; and
a control circuit that adjusts the first memory cell and the second memory cell such that data is written into the first memory cell without affecting the drive strength of the second pass transistor, wherein the control circuit comprises a write assist circuit.

17. The integrated circuit of claim 16, wherein the control circuit adjusts a power supply voltage for the first memory cell and the second memory cell.

18. The integrated circuit of claim 16, wherein the second pass transistor remains off while the control circuit is writing the data into the first memory cell.

\* \* \* \* \*